(12) United States Patent
Robin et al.

(10) Patent No.: US 11,404,401 B2
(45) Date of Patent: Aug. 2, 2022

(54) PROCESS FOR MANUFACTURING AN LED-BASED EMISSIVE DISPLAY DEVICE

(71) Applicant: Commissariat à l'Énergie Atomique et aux Énergies Alternatives, Paris (FR)

(72) Inventors: Ivan-Christophe Robin, Grenoble (FR); Stéphane Caplet, Sassenage (FR); Marie-Claire Cyrille, Sinard (FR); Bertrand Delaet, Bernin (FR); Sophie Giroud, Saint-Egreve (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 16/611,808

(22) PCT Filed: May 4, 2018

(86) PCT No.: PCT/FR2018/051137
§ 371 (c)(1),
(2) Date: Nov. 7, 2019

(87) PCT Pub. No.: WO2018/206891
PCT Pub. Date: Nov. 15, 2018

(65) Prior Publication Data
US 2020/0303359 A1 Sep. 24, 2020

(30) Foreign Application Priority Data
May 9, 2017 (FR) .................................... 17/54045

(51) Int. Cl.
*H01L 25/16* (2006.01)
*H01L 21/683* (2006.01)
(Continued)

(52) U.S. Cl.
CPC ........ *H01L 25/167* (2013.01); *H01L 21/6835* (2013.01); *H01L 24/08* (2013.01);
(Continued)

(58) Field of Classification Search
None
See application file for complete search history.

(56) References Cited

U.S. PATENT DOCUMENTS 11,069,647 B2 * 7/2021 Zhou ..................... H01L 23/544
2007/0231826 A1 10/2007 Huber et al.
(Continued)

FOREIGN PATENT DOCUMENTS

| EP | 2 667 422 A2 | 11/2013 |
| EP | 2 865 021 A1 | 4/2015 |
| WO | WO 2005/122706 A2 | 12/2005 |

OTHER PUBLICATIONS

International Preliminary Report on Patentability for International Application No. PCT/FR2018/051137, dated Nov. 21, 2019.
(Continued)

*Primary Examiner* — Michelle Mandala
(74) *Attorney, Agent, or Firm* — Wolf, Greenfield & Sacks, P.C.

(57) ABSTRACT

A method of manufacturing an electronic device, including: a) forming a plurality of chips, each including a plurality of connection areas and at least one first pad; b) forming a transfer substrate including, for each chip, a plurality of connection areas and at least one second pad, one of the first and second pads being a permanent magnet and the other one of the first and second pads being either a permanent magnet or made of a ferromagnetic material; and c) affixing the chips to the transfer substrate to connect the connection areas of the chips to the connection areas of the transfer substrate, by using the magnetic force between the pads to
(Continued)

align the connection areas of the chips with the corresponding connection areas of the transfer substrate.

14 Claims, 6 Drawing Sheets

(51) Int. Cl.
*H01L 23/00* (2006.01)
*H01L 33/32* (2010.01)
*H01L 33/38* (2010.01)
*H01L 33/62* (2010.01)

(52) U.S. Cl.
CPC .............. *H01L 24/89* (2013.01); *H01L 33/32* (2013.01); *H01L 33/382* (2013.01); *H01L 33/62* (2013.01); H01L 2221/68363 (2013.01); H01L 2224/05644 (2013.01); H01L 2224/05647 (2013.01); H01L 2224/05669 (2013.01); H01L 2224/08237 (2013.01); H01L 2224/08238 (2013.01); H01L 2224/80006 (2013.01); H01L 2224/80099 (2013.01); H01L 2224/80121 (2013.01); H01L 2933/0066 (2013.01)

(56) References Cited

U.S. PATENT DOCUMENTS

| 2007/0231961 | A1 | 10/2007 | Teshirogi et al. |
| 2014/0191246 | A1 | 7/2014 | Oraw |
| 2016/0155892 | A1 | 6/2016 | Li et al. |
| 2018/0033773 | A1* | 2/2018 | Huang .................... H01L 25/50 |
| 2018/0045383 | A1* | 2/2018 | Hasegawa ............ H05K 3/3489 |
| 2018/0358339 | A1* | 12/2018 | Iguchi ..................... H01L 33/62 |

OTHER PUBLICATIONS

International Search Report and Written Opinion for International Application No. PCT/FR2018/051137, dated Jul. 26, 2018.

* cited by examiner

PROCESS FOR MANUFACTURING AN LED-BASED EMISSIVE DISPLAY DEVICE

This Application is a national stage filing under 35 U.S.C. § 371 of International Patent Application Serial No. PCT/FR2018/051137, filed May 4, 2018, which claims priority to French patent application FR17/54045, filed May 9, 2017, the contents of these applications are incorporated herein by reference in their entirety.

BACKGROUND

The present application concerns the forming of an emissive image display device comprising light-emitting diodes (LEDs), for example, a screen for a television, a computer, a smart phone, a tablet, etc.

DISCUSSION OF THE RELATED ART

A method of manufacturing an image display device comprising a plurality of elementary electronic microchips arranged in an array on a same transfer substrate has already been provided, in French patent application No. 1561421 filed on Nov. 26, 2015. According to this method, the microchips and the transfer substrate are manufactured separately. Each microchip comprises a stack of a LED and of a circuit for controlling the LED. The control circuit comprises a connection surface opposite to the LED, comprising a plurality of electric connection areas intended to be connected to the transfer substrate for the control of the microchip. The transfer substrate comprises a connection surface comprising, for each microchip, a plurality of electric connection areas intended to be respectively connected to the electric connection areas of the microchip. The chips are then placed on the transfer substrate, with their connection surfaces facing the connection surface of the transfer substrate, and affixed to the transfer substrate to connect the electric connection areas of each microchip to the corresponding electric connection areas of the transfer substrate.

It would be desirable to be able to at least partly improve certain aspects of this method.

In particular, due to the relatively small dimensions of the microchips, and given that each microchip comprises a plurality of separate electric connection areas, the alignment of the electric connection areas of the microchips with the corresponding electric connection areas of the transfer substrate is relatively difficult to achieve. It would be desirable to ease the implementation of such an alignment and/or to improve the obtained alignment accuracy.

SUMMARY

Thus, an embodiment provides an electronic device manufacturing method, comprising the steps of:

a) forming a plurality of chips, each comprising:
a plurality of electric connection areas arranged on a connection surface of the chip, and
at least one first pad arranged in the vicinity of the chip connection surface;

b) forming a transfer substrate comprising, for each chip:
a plurality of electric connection areas arranged on a connection surface of the transfer substrate, and
at least one second pad arranged in the vicinity of the connection surface of the transfer substrate, one of the first and second pads being a permanent magnet and the other one of the first and second pads being either a permanent magnet or made of a ferromagnetic material; and c) affixing the chips to the transfer substrate by direct bonding to electrically connect the electric connection areas of each chip to the corresponding electric connection areas of the transfer substrate, by using the magnetic force between the first and second pads to align the electric connection areas of the chips with the corresponding electric connection areas of the transfer substrate.

According to an embodiment, in each chip, the first pad emerges on the side of the connection surface of the microchip.

According to an embodiment, in each chip, the first pad is buried under the connection surface of the chip.

According to an embodiment, in each chip, the connection surface of the chip is planar, the electric connection areas of the chip being flush with an external surface of a passivation layer of the chip.

According to an embodiment, the second pads emerge on the side of the connection surface of the transfer substrate.

According to an embodiment, the second pads are buried under the connection surface of the transfer substrate.

According to an embodiment, the connection surface of the transfer substrate is planar, the electric connection areas of the transfer substrate being flush with an external surface of a passivation layer of the transfer substrate.

According to an embodiment, the electric connection areas of the transfer substrate protrude from the connection surface of the transfer substrate.

According to an embodiment:
at the end of step a), the chips are arranged on a support substrate with a pitch between chips smaller than the pitch between chips of the final display device; and
at step c), a plurality of chips are selectively separated from the support substrate at the pitch of the final display device and affixed to the transfer substrate at this same pitch.

According to an embodiment:
at the end of step a), the chips are only laid, with no bonding, on the support substrate; and
at step c), the transfer substrate is brought above the chips, with its connection surface facing the connection surfaces of the chips, to simultaneously collect a plurality of chips at the pitch of the final display device.

According to an embodiment, the support substrate comprises cavities having the chips arranged therein so that the chips are laterally maintained by the cavity walls.

According to an embodiment, the bottom of each cavity of the support substrate is non-planar.

According to an embodiment, each chip comprises a stack of a LED and of an active circuit for controlling the LED.

Another embodiment provides an emissive display device comprising LEDs formed by a method such as defined hereabove.

BRIEF DESCRIPTION OF THE DRAWINGS

The foregoing and other features and advantages will be discussed in detail in the following non-limiting description of specific embodiments in connection with the accompanying drawings, in which.

DETAILED DESCRIPTION

Figure 1:
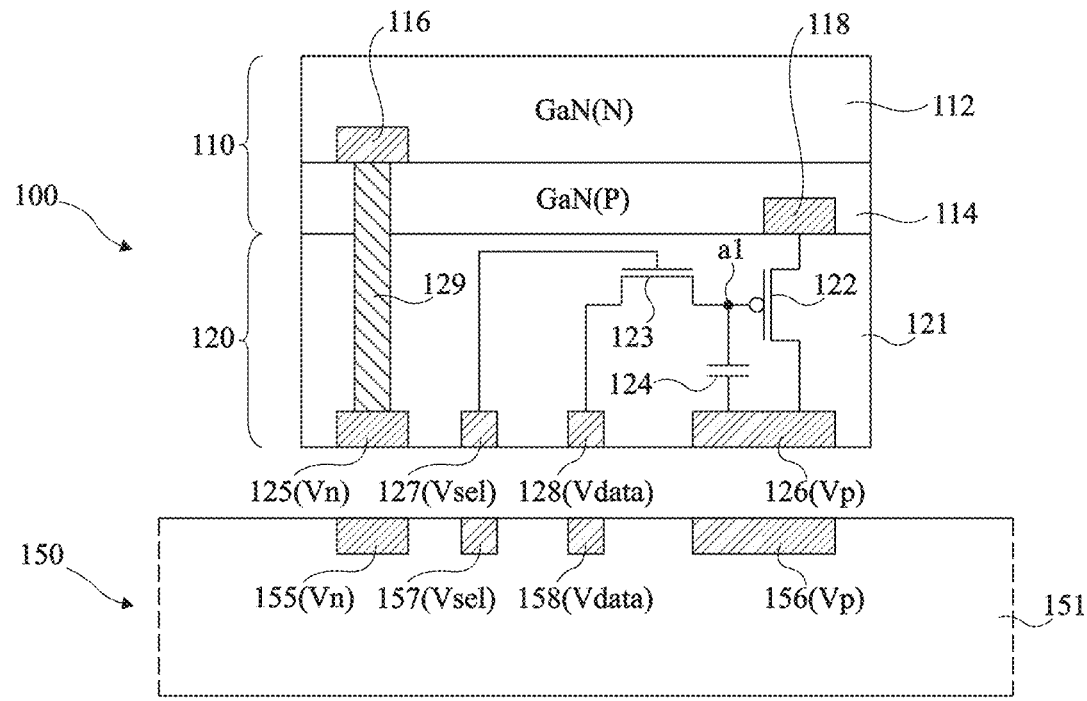
FIG. 1 is a cross-section view schematically and partially illustrating a step of transferring a microchip onto a transfer substrate, according to an example of a method of manufacturing an emissive display device comprising LEDs.

The same elements have been designated with the same reference numerals in the various drawings and, further, the various drawings are not to scale. For clarity, only those steps and elements which are useful to the understanding of the described embodiments have been shown and are detailed. In particular, the manufacturing of the elementary microchips and of the transfer substrate of the described display devices has not been detailed, the manufacturing of these elements being within the abilities of those skilled in the art based on the teachings of the present description. As an example, the elementary microchips and the transfer substrate may be manufacturing according to methods identical or similar to those described in the above-mentioned French patent application No. 1561421, which is herein incorporated by reference as authorized by law. In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings, it being understood that, in practice, the described devices may be oriented differently. The terms "approximately", "substantially", and "in the order of" are used herein to designate a tolerance of plus or minus 10%, preferably of plus or minus 5%, of the value in question.

FIG. 1 is a cross-section view schematically and partially illustrating a step of transferring a microchip 100 onto a transfer substrate 150, according to an example of a method of manufacturing an emissive display device comprising LEDs.

FIG. 1 more particularly shows microchip 100 and transfer substrate 150 before the actual step of affixing the microchip onto the transfer substrate.

In particular, a display device may comprise a plurality of identical or similar elementary chips 100 assembled on a same transfer substrate according to a layout in an array of rows and columns, the chips being connected to elements of electric connection of the substrate for the control thereof, and each microchip for example corresponding to a pixel of the display device.

Microchip 100 comprises, in an upper portion, an inorganic semiconductor LED 110 and, in a lower portion forming one piece with the upper portion, an active control circuit 120 based on single-crystal silicon, capable of controlling the emission of light by the LED.

LED 110 comprises at least one homojunction or one heterojunction, for example, a PN junction formed of a stack of an upper N-type semiconductor layer 112 and of a lower P-type semiconductor layer 114, and two electric contacts 116 and 118 (respectively in contact with layer 112 and with layer 114 in the shown example) to inject an electric current through the stack, in order to generate light. As an example, LED 110 is a gallium nitride LED or is based on any other III-V semiconductor capable of forming a LED.

Control circuit 120 is formed inside and on top of a single-crystal silicon block 121 and comprises electronic components, and particularly one or plurality of transistors and at least one capacitive element for holding a bias signal, for the individual control of LED 110. The upper surface of control circuit 120 is mechanically and electrically in contact with LED 110. The lower surface of circuit 120, defining a connection surface of the microchip, comprises a plurality of electric connection areas intended to be connected to corresponding connection areas of transfer substrate 150 for the control of the microchip. In the shown example, the lower surface of circuit 120 comprises four electric connection areas 125, 126, 127, and 128. Areas 125 and 126 are intended to respectively receive a low power supply potential (for example, the ground) Vn and a high power supply potential (that is, higher than the low power supply potential) Vp of the microchip. Areas 127 and 128 are intended to receive microchip control signals. More particularly, area 127 is intended to receive a microchip selection signal Vsel, and area 128 is intended to receive a signal Vdata for setting the luminosity level of the microchip. Connection areas 125, 126, 127, and 128 are for example made of metal, for example, of copper, of gold, or of titanium. In the present example, control circuit 120 comprises two MOS transistors 122 and 123 and one capacitive element 124, for example, a capacitor. Transistor 122, for example, a P-channel transistor, has a first conduction node (source or drain) connected to the connection area 126 (Vp) of the microchip, a second conduction node (drain or source) connected to the anode contact terminal 118 of LED 110, and a control node (gate) connected to an intermediate node a1 of circuit 120. Capacitive element 124 has a first electrode connected to node a1 and a second electrode connected to the microchip connection area 126 (Vp). Transistor 123, for example, an N-channel transistor, has a first conduction node connected to the connection area 128 (Vdata) of the microchip, a second conduction node connected to node a1, and a control node connected to the connection area 127 (Vsel) of the microchip. Microchip 100 further comprises an insulated conductive via 129 connecting the electric connection area 125 (Vn) of the microchip to the cathode contact terminal 116 of LED 110.

Elementary microchip 100 operates as follows during a phase of updating the luminosity level of the pixel. Transistor 123 is turned on (made conductive) by the application of an adapted control signal to terminal 127 (Vsel). Capacitive element 124 then charges to a voltage level which is a function of the adjustment signal applied to terminal 128 (Vdata) of the microchip. The level of adjustment signal Vdata sets the potential of node a1 and, accordingly, the intensity of the current injected into the LED by transistor 122, and thus the light intensity emitted by the LED. Transistor 123 can then be turned back off. Node a1 then remains at a potential substantially equal to potential Vdata. Thus, the current injected into the LED remains substantially constant after the turning back off of transistor 123, and this, until the next update of the potential of node a1.

Transfer substrate 150 for example comprises a support plate or sheet 151 made of an insulating material, having electric connection elements, for example, conductive tracks and areas, arranged thereon. Transfer substrate 150 is for example a passive substrate, that is, it only comprises electric connection elements for conveying the microchip control and power supply signals. Transfer substrate 150 comprises a connection surface, its upper surface in the shown example, intended to receive microchips 100. For each microchip of the display device, transfer substrate 150 comprises, on its connection surface, a plurality of electric connection areas (one per electric connection area of the microchip) intended to be respectively connected to the electric connection areas of the microchip. Thus, in the present example, for each microchip 100 of the display device, transfer substrate 150 comprises four electric connection areas 155, 156, 157, and 158 intended to be respectively connected to electric connection areas 125, 126 127, and 128 of microchip 100, to convey control signals Vn, Vp, Vsel, and Vdata of the microchip. The electric connection areas 155, 156, 157, and 158 of the transfer substrate are for example made of the same conductive material as the electric connection areas 125, 126, 127, and 128 of the microchips, for example, copper, gold, or titanium.

During the transfer of microchip 100 onto transfer substrate 150, the connection surface of the microchip is placed in contact with the connection surface of the transfer substrate to electrically connect the electric connection areas 125, 126, 127, and 128 of the microchip respectively to the corresponding electric connection areas 155, 156, 157, and 158 of the transfer substrate. The affixing of microchip 100 to the transfer substrate is performed by direct bonding, that is, with no added adhesive or solder material at the interface between the microchip and the substrate, for example, at ambient temperature and pressure. To achieve this, the electric connection areas of the microchip and of the transfer substrate may have been previously prepared to obtain a sufficient planeness, for example, a roughness lower than 1 nm, to achieve a direct bonding of areas 125, respectively 126, respectively 127, respectively 128, on areas 155, respectively 156, respectively 157, respectively 158. An anneal may possibly be provided after the bonding, for example, at a temperature in the range from 150 to 250° C., to increase the strength of the bonding.

As indicated hereabove, a difficulty of such a method is the alignment of the electric connection areas of the microchip with the corresponding electric connection areas of the transfer substrate to obtain a good electric connection between the microchip and the transfer substrate.

Indeed, the microchips for example have, in top view, a maximum dimensions smaller than or equal to 100 µm, for example, smaller than or equal to 50 µm, for example, in the order of 10 µm. Each microchip comprising a plurality of electric connection areas (four in the example of FIG. 1), the microchip alignment should be very accurate, for example, with an accuracy better than to within 1 µm.

Figure 2:
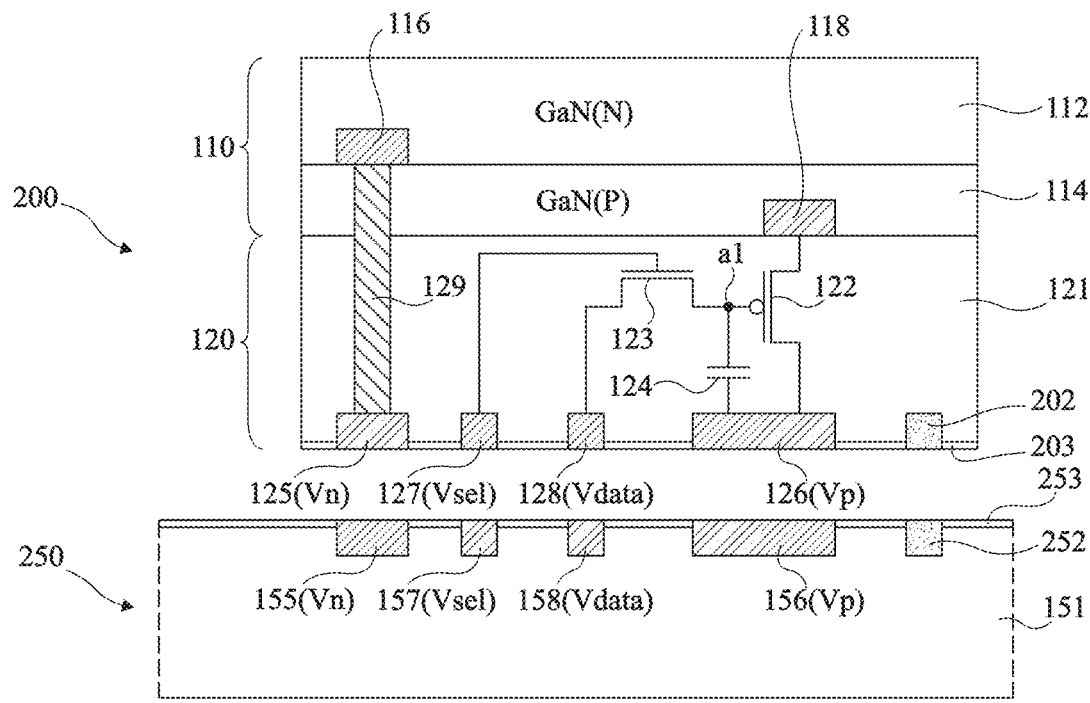
FIG. 2 is a cross-section view schematically and partially illustrating a step of transferring a microchip onto a transfer substrate, according to an embodiment of a method of manufacturing an emissive display device comprising LEDs.

FIG. 2 is a cross-section view schematically and partially illustrating a step of transferring a microchip 200 onto a transfer substrate 250, according to an embodiment of a method of manufacturing an emissive display device comprising LEDs. FIG. 2 more particularly shows microchip 200 and transfer substrate 250 before the actual step of affixing the microchip onto the transfer substrate.

Microchip 200 and transfer substrate 250 of FIG. 2 comprise elements common with microchip 100 and transfer substrate 150 of FIG. 1. Hereafter, only the differences between the embodiment of FIG. 2 and the example of FIG. 1 will be detailed.

Microchip 200 of FIG. 2 comprises the same elements as microchip 100 of FIG. 1, arranged substantially in the same way, and differs from microchip 100 of FIG. 1 mainly in that it further comprises, in the vicinity of its connection surface, that is, closer to its connection surface than to its opposite surface, a pad 202 made of a ferromagnetic material, for example, of a nickel-iron alloy.

In the example of FIG. 2, pad 202 emerges on the side of the connection surface of the microchip.

Further, in the present example, the connection surface of microchip 200 is substantially planar, that is, the electric connection areas 125, 126, 127, and 128 and the ferromagnetic pad 202 of the microchip are flush with the lower surface of a substantially planar insulating layer 203 for passivating the microchip. As an example, the electric connection areas 125, 126, 127, and 128 and the ferromagnetic pad 202 of the microchip are formed according to a damascene-type method, comprising a step of depositing insulating passivation layer 203 over the entire lower surface of the microchip, followed by a step of etching cavities intended to receive electric connection areas 125, 126, 127, and 128 and pad 202 on the lower surface side of the microchip, followed by a step of filling the cavities with a conductive material to form the electric connection areas and with a ferromagnetic material to form pad 202, followed by a step of chem.-mech. polishing to planarize the lower surface of the chip to place at a same level the lower surfaces of electric connection areas 125, 126, 127, and 128 and of pad 202, and the lower surface of passivation layer 203.

As an example, the electric connection areas 125, 126, 127, and 128 of microchip 200 are made of the same material as ferromagnetic pad 202, which simplifies the microchip manufacturing method.

The transfer substrate 250 of FIG. 2 comprises the same elements as the transfer substrate 150 of FIG. 1 and differs from the transfer substrate 150 of FIG. 1 mainly in that it further comprises, in the vicinity of its connection surface, that is, closer to its connection surface than to its opposite surface, for each microchip 200 of the display device, in addition to the connection areas 155, 156, 157, and 158 intended to be connected to the connection areas 125, 126, 127, and 128 of the microchip, a permanent magnet 252 forming a pad having, in front view, substantially the same general shape and the same dimensions as the ferromagnetic pad 202 of the microchip.

The positioning of pad 252 relative to the electric connection areas 155, 156, 157 and 158 of the transfer substrate is substantially identical to the positioning of pad 202 relative to the electric connection areas 125, 126, 127, and 128 of the microchip. In other words, when the electric connection areas 125, 126, 127, and 128 of the microchip are aligned respectively vertically in line with the electric connection areas 155, 156, 157, and 158 of the transfer substrate, the ferromagnetic pad 202 of the microchip is located vertically in line with the permanent magnet 252 of the transfer substrate.

In the example of FIG. 2, magnet pad 252 emerges on the side of the connection area of the transfer substrate.

Further, in the present example, the connection surface of the transfer substrate is substantially planar, that is, the electric connection areas 155, 156, 157, and 158 and the magnet pad 252 of the transfer substrate are flush with the level of the upper surface of a substantially insulating layer 253 for passivating the transfer substrate. As an example, the electric connection areas 155, 156, 157, and 158 and the magnet pad 252 of the transfer substrate are formed according to a damascene-type method, comprising a step of depositing insulating passivation layer 253 over the entire upper surface of the transfer substrate, followed by a step of etching cavities intended to receive electric connection areas 155, 156, 157, and 158 and pad 252 on the upper surface side of the transfer substrate, followed by a step of filling the cavities with a conductive material to form the electric connection areas and with a permanent magnet material to form pad 252, followed by a step of chem.-mech. polishing to planarize the upper surface of the substrate to place at a same level the upper surfaces of electric connection areas 155, 156, 157, and 158 and of pad 252, and the upper surface of passivation layer 253.

As an example, magnet pad 252 is formed of a stack of a plurality of metal layers, for example, a stack of an antiferromagnetic layer, for example, made of an alloy of platinum-manganese, iridium manganese, or iron-manganese, and of a ferromagnetic layer, for example, made of an alloy of iron-cobalt, iron-cobalt-boron, or nickel-iron, in contact with the antiferromagnetic layer. As a variation, the magnet pad may be formed by an alternation of a plurality of antiferromagnetic layers or of a plurality of alternated ferromagnetic layers. The stack may further comprise a lower seed layer, for example, made of tantalum, or of a ruthenium-tantalum alloy, and an upper protection layer, for example, made of tantalum. Each layer of the magnet pad for example has a thickness in the range from 5 to 100 nm. The layers of the magnet pad may for example be deposited by physical vapor deposition (PVD). After deposition and etching at the desired dimensions, an anneal of the magnet pad may be provided, for example, at a temperature in the range from 150 to 400° C., for example, under a magnetic field in the range from 0.1 to 2 T.

As an example, the magnet pad is formed of a stack of:
25 successive repetitions of a stack of a tantalum layer having a 5-nm thickness, of a Pt50Mn50 alloy layer having a 7-nm thickness, of a Fe20Co80 alloy layer having a 20-nm thickness, and of a Pt50Mn50 alloy layer having a 7-nm thickness; and
an upper tantalum protection layer having a 10-nm thickness.

As a variation, the magnet pad is formed of a stack of:
a tantalum layer having a 5-nm thickness;
a copper layer having a 2-nm thickness;
30 successive repetitions of a stack of a layer of a Ir20Mn80 alloy having a 7-nm thickness and of a layer of a Fe65Co35 alloy having a 25-nm thickness;
a layer of a Ir20Mn80 alloy having a 7-nm thickness; and
a tantalum layer having a 10-nm thickness.

In front view, magnet pad 252 and ferromagnetic pad 202 for example each have a generally square, rectangular, or circular shape, with a maximum dimension in the range from 0.5 to 100 µm. Pads 202 and 252 preferably have, in front view, a maximum dimension of the same order of magnitude as the desired alignment accuracy, for example, a maximum dimension in the range from 0.5 to 5 µm, for example, in the order of from 1 to 2 µm.

During the actual transfer step, microchip 200 is brought opposite transfer substrate 250, with its connection surface facing the connection surface of the transfer substrate. More particularly, the electric connection areas 125, 126, 127, and 128 of the microchip are positioned approximately vertically in line with the corresponding electric connection areas 155, 156, 157, and 158 of the transfer substrate, without however for the connection surface of the microchip to be placed in contact with the connections surface of the transfer substrate. The microchip is then released, that, made free to displace, particularly laterally, with respect to the transfer substrate. At this time, the magnetic force between the ferromagnetic pad 202 of the microchip and the corresponding magnet pad 252 of the transfer substrate results in bonding the connection surface of the microchip to the connection surface of the transfer substrate, by accurately aligning ferromagnetic pad 202 with magnet pad 252, and thus the electric connection areas of the microchip with the corresponding electric connection areas of the transfer substrate.

It should be noted that the self-alignment of the microchip on the transfer substrate is essentially performed before the connection surface of the microchip comes into contact with the connection surface of the transfer substrate. Indeed, once the connection surfaces of the microchip and of the transfer substrate have been placed into contact, a direct bonding is immediately obtained between the two connection surfaces, preventing any displacement of the microchip relative to the transfer substrate. To avoid too fast a direct bonding of the microchip to the transfer substrate, and thus increase the duration available for the self-alignment of the microchip on the transfer substrate, a liquid may possibly be arranged at the interface between the microchip and the transfer substrate during the transfer.

Once the alignment of microchip 200 with the transfer substrate has been performed with the assistance of ferromagnetic pad 202 and of magnet pad 252, and the direct bonding of the microchip to substrate 250 has been obtained, an anneal may possibly be provided, for example, at a temperature in the range from 150 to 250° C., to increase the bonding energy and improve the electric connection between the connection areas 125, 126, 127, and 128 of the microchip and the connection areas 155, 156, 157, and 158 of the transfer substrate.

Figure 3:
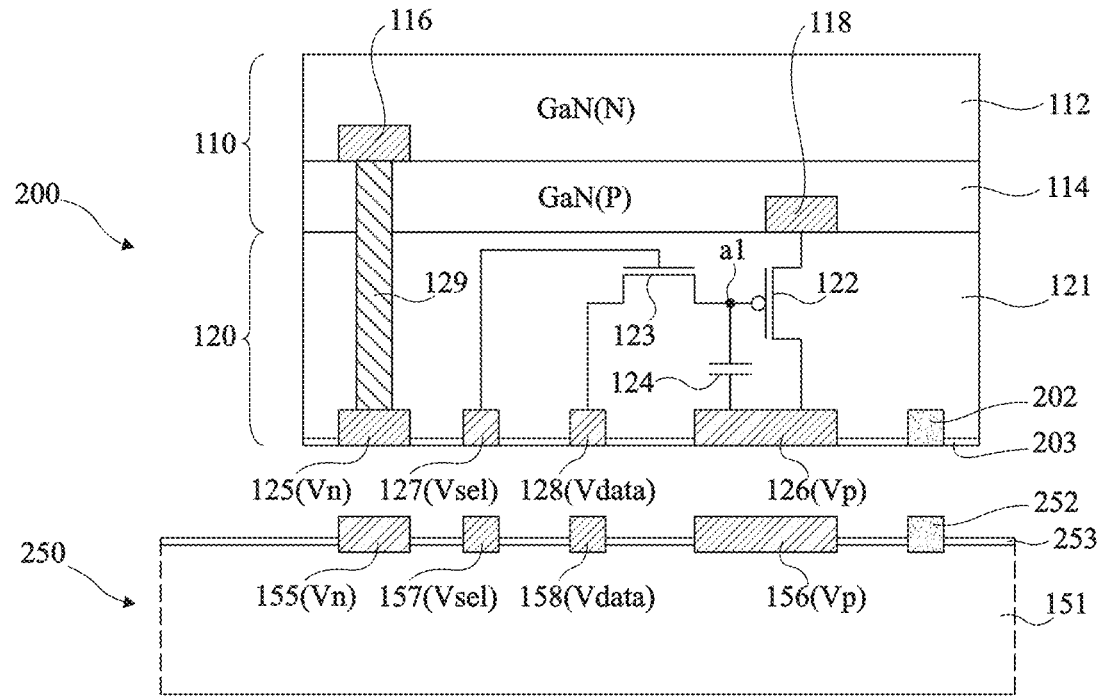
FIG. 3 is a cross-section view schematically and partially illustrating a step of transferring a microchip onto a transfer substrate, according to another embodiment of a method of manufacturing an emissive display device comprising LEDs.

FIG. 3 is a cross-section view schematically and partially showing an alternative embodiment of the transfer method of FIG. 2. As in the example of FIG. 2, FIG. 3 shows microchip 200 and transfer substrate 250 before the actual step of bonding the microchip to the transfer substrate.

The microchip of FIG. 3 comprises the same elements as the microchip of FIG. 2, arranged substantially in the same way.

The transfer substrate of FIG. 3 comprises the same elements as the transfer substrate of FIG. 2, and differs from the transfer substrate of FIG. 2 mainly in that, in the example of FIG. 3, the electric connection areas 155, 156, 157, and 158 and the magnet pad 252 of the transfer substrate form protrusions jutting out of the connection surface of the substrate. Thus, conversely to the transfer substrate of FIG. 2 having a substantially planar connection surface, the transfer substrate of FIG. 3 has a structured connection surface. More particularly, in the shown example, the protrusions formed by electric connection areas 155, 156, 157, and 158 and magnet pad 252 have a mesa or plate shape.

In practice, as will be explained in further detail hereafter in relation with FIGS. 5A to 5C, on transfer of microchips 200 onto substrate 250, a plurality of microchips arranged on a same support substrate (not shown in FIG. 3), with a pitch between chips smaller than the pitch between chips of the final device, may be brought opposite the transfer substrate. Only part of the microchips is then transferred from the support substrate to the transfer substrate, at the pitch of the transfer substrate, the other microchips remaining on the support substrate to be subsequently transferred either to another region of the transfer substrate or on another transfer substrate.

An advantage of the variation of FIG. 3 is that the protruding shape of the electric connection areas 155, 156, 157 and 158 and of the magnet pad 252 of the transfer substrate enables for only the microchips transferred from the support substrate to the transfer substrate to be placed in contact with the connection surface of the transfer substrate. This particularly enables to avoid damaging the connection surface of the microchips intended to remain on the support substrate.

Figure 4:
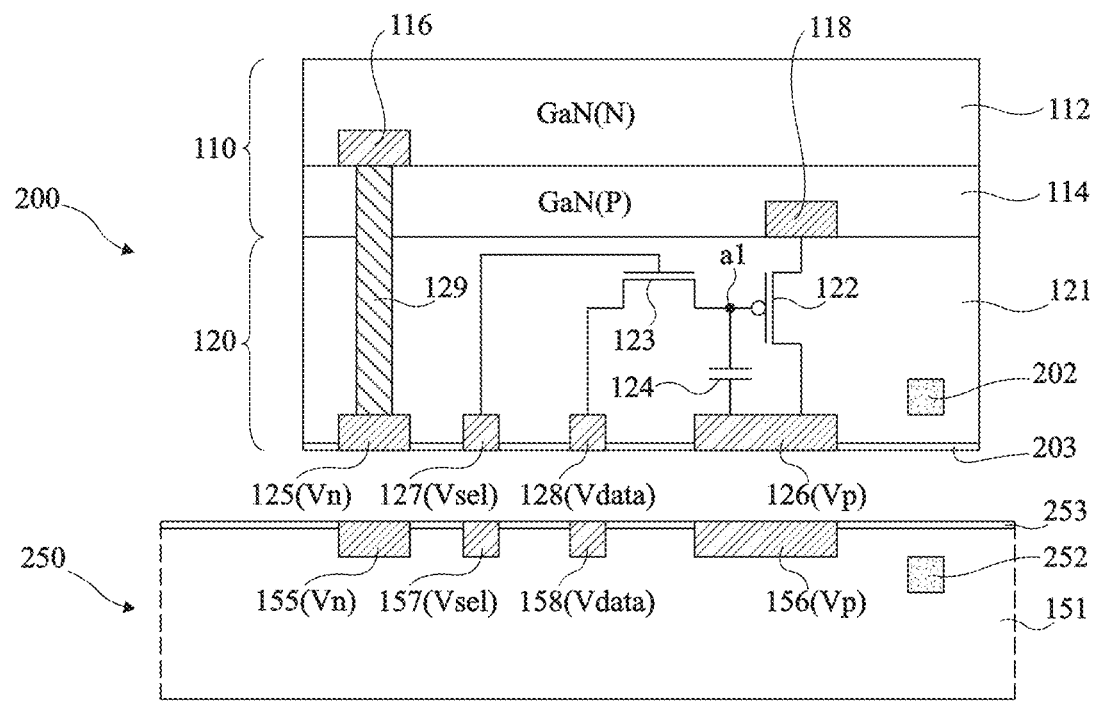
FIG. 4 is a cross-section view schematically and partially illustrating a step of transferring a microchip onto a transfer substrate, according to another embodiment of a method of manufacturing an emissive display device comprising LEDs.

In another variation, only electric connection areas 155, 156, 157 and 158 form protrusions jutting out of the connection surface of transfer substrate 250, magnet 252 being flush with the upper surface of passivation layer 253 as described hereabove in relation with FIG. 2, or being buried under the connection surface of the transfer substrate as described hereafter in relation with FIG. 4.

FIG. 4 is a cross-section view schematically and partially showing another alternative embodiment of the transfer method of FIG. 2. As in the example of FIG. 2, FIG. 4 shows microchip 200 and transfer substrate 250 before the actual step of affixing the microchip to the transfer substrate.

The microchip of FIG. 4 comprises the same elements as the microchip of FIG. 2, and differs from the microchip of FIG. 2 in that, in the microchip of FIG. 4, ferromagnetic pad 202 is not flush with the connection surface of the microchip, but is buried under the connection surface of the microchip.

Similarly, the transfer substrate of FIG. 4 comprises the same elements as the transfer substrate of FIG. 2, and differs from the transfer substrate of FIG. 2 in that, in the transfer substrate of FIG. 4, magnet pad 252 is not flush with the connection surface of the substrate but is buried under the connection surface of the substrate.

As a variation, only one of pads 202 and 252 is buried, the other pad being flush with the external surface of the passivation layer coating the connection surface.

In another variation, the ferromagnetic pad 202 of the microchip is buried, and the magnet pad 252 of the transfer substrate protrudes from the connection surface of the transfer substrate, as described in relation with FIG. 3.

Figure 5A:
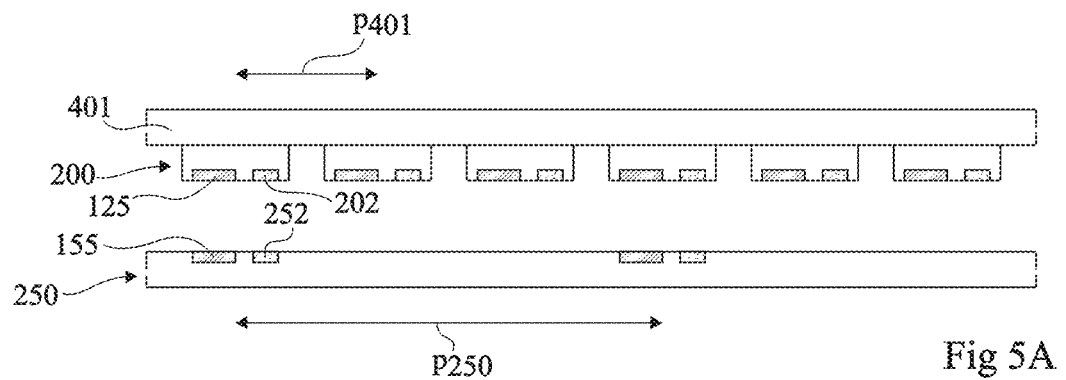
FIGS. 5A, 5B, and 5C are cross-section views illustrating steps of an embodiment of a method of manufacturing an emissive display device comprising LEDs.
Figure 5B:
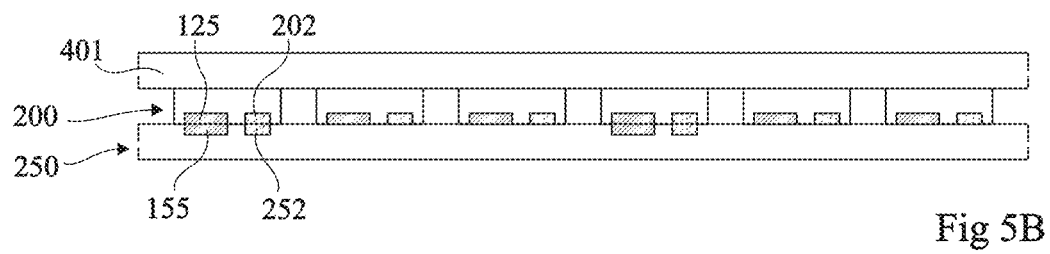
Figure 5C:
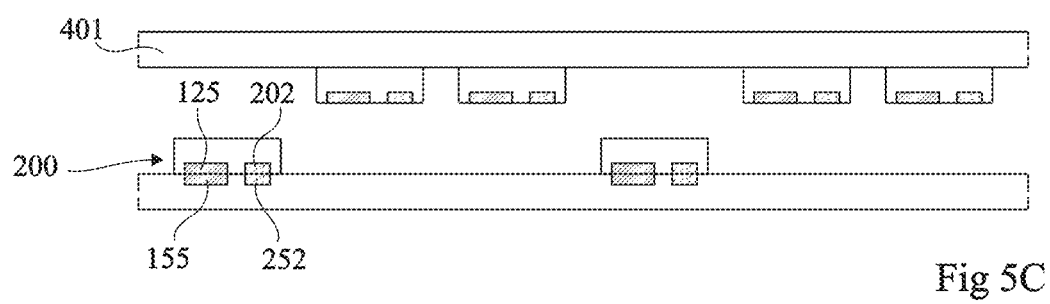

FIGS. 5A, 5B, and 5C are cross-section views illustrating steps of an embodiment of a method of manufacturing an emissive display device comprising LEDs.

FIG. 5A illustrates a step during which, after having separately formed microchips 200 on a support substrate 401, and transfer substrate 250, microchips 200 are positioned approximately opposite the corresponding transfer areas of substrate 250, with the connection surfaces of the microchips facing the connection surface of substrate 250, using support substrate 401 as a handle.

As an example, the method of manufacturing microchips 200 is a method of the type described in above-mentioned French patent application No. 1561421, comprising:

the forming of an array of identical or similar elementary control circuits 120, inside and on top of a silicon substrate;

the separate forming, on an adapted growth substrate, for example, made of sapphire, of a corresponding array of identical or similar elementary LEDs 110;

the transfer, onto each other, of the array of control circuits 120 and of LED array 110, the two arrays being solidly attached to each other, for example, by direct heterogeneous bonding;

the removal of the growth substrate of the LEDs and its replacement with a support substrate, corresponding to substrate 401 of FIG. 5A, affixed by so-called temporary bonding, having a lower bonding energy than the initial bond between the microchips and the growth substrate of the LEDs, to ease a subsequent microchip collection step; and the individualization of each microchip 200 by etching around it a trench vertically extending from the connection surface of the microchip to substrate 401, to obtain an array of individualized microchips affixed to support substrate 401 by their LEDs, as shown in FIG. 5A.

As a variation, the step of replacing the LED growth substrate by a different support substrate may be omitted, in which case substrate 401 of FIG. 5A is the LED growth substrate. In this case, the bonding between substrate 401 and LEDs 110 may possibly be weakened, by means of a laser beam projected through substrate 401 from its back side, that is, its surface opposite to microchips 200.

In another variation, the stack of the semiconductor layers forming the LEDs may be placed on the array of elementary control circuits 120 before the individualization of elementary LEDs 110. The LED growth substrate is then removed to allow the individualization of LEDs 110, after which support substrate 401 may be bonded to the surface of LEDs 110 opposite to control circuits 120.

Figure 9:
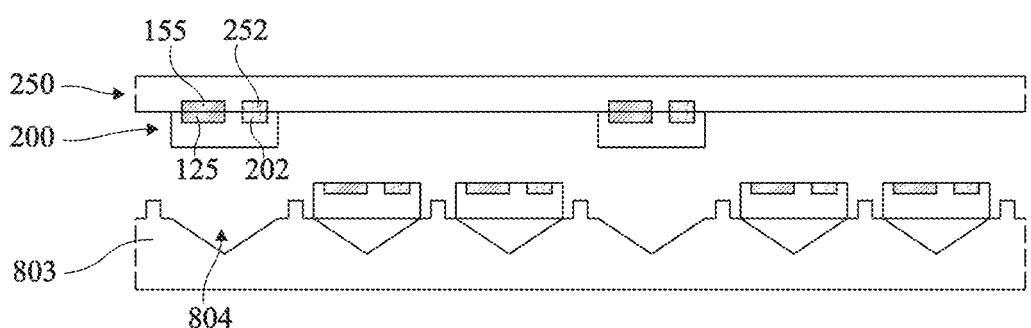
FIG. 9 is a cross-section view illustrating an alternative implementation of the method of FIGS. 8A to 8D.

For simplification, a single electric connection area 125 per microchip has been shown in FIGS. 5A to 5C, as well as in the next drawings (up to FIG. 9). In practice, as previously indicated, each microchip comprises a plurality of electric connection areas on its connection surface. Further, still to simplify the drawings, microchips 200 have not been detailed in FIGS. 5A to 5C and the following. Only ferromagnetic pad 202 is shown in addition to electric connection area 125.

Similarly, transfer substrate 250 has not been detailed in FIGS. 5A to 5C and the following. For each reception area of a microchip, only magnet pad 252 and a single electric connection area 155 are shown.

The microchips 200 affixed to support substrate 401 by their LEDs are brought opposite corresponding reception areas of transfer substrate 250, with their connection surfaces facing the connection surface of substrate 250.

Support substrate 401 is then released, that is, left free to move, particularly laterally, with respect to transfer substrate 250.

At this stage, the magnetic force exerted between ferromagnetic pad 202 of each microchip and the corresponding magnet pad 252 of the transfer substrate enables to accurately align the electric connection areas of the microchip with the corresponding electric connection areas of the transfer substrate.

It should be noted that the fact of simultaneously transferring a plurality of microchips 200 onto substrate 250 enables to benefit from a higher alignment restoring force than if a single chip was transferred, since the magnetic forces exerted by the ferromagnetic pad/magnet pad pairs associated with the different transferred microchips add.

Microchips 200 are then affixed to transfer substrate 250 by direct bonding of the electric connection areas of the microchips onto the corresponding electric connection areas of the transfer substrate.

Microchips 200 are then separated from support substrate 401, and the latter is removed.

In practice, pitch $p_{401}$ of the microchips on substrate 401, for example, in the range from 10 to 50 µm, may be smaller than pitch $p_{250}$ of the final device after their placing on substrate 250, for example, in the range from 15 µm to 1 mm, for example, in the range from 100 to 500 µm.

In the example described in relation with FIGS. 5A to 5C, as well as in the examples of the next drawings, pitch $p_{250}$ of the microchips 200 on transfer substrate 250 is a multiple of pitch $p_{401}$ of the microchips on support substrate 401. Thus, it is provided to only place part of microchips 200 of substrate 401 on substrate 250, at the pitch of transfer substrate 250 (that is, one chip out of n, with n=$p_{250}/p_{401}$), and then, if need be, to shift substrate 401 with the remaining microchips to place another part of microchips 200 of substrate 401 on substrate 250, and so on until all the microchips of the display device have been affixed to transfer substrate 250.

For each iteration, once the alignment of microchips 200 with the transfer substrate has been performed with the assistance of the ferromagnetic pad 202/magnet pad 252 pairs (FIG. 5B), microchips 200 are selectively separated from support substrate 401. Support substrate 401 and the remaining microchips 200 are then removed, as illustrated in FIG. 5C.

To selectively separate microchips 200 from support substrate 401, a light bonding between support substrate 401 and microchips 200 may be provided, so that only the microchips 200 aligned with the corresponding connection areas of transfer substrate 250 are torn off during the removal of support substrate 401, under the effect of the magnetic force exerted between ferromagnetic pad 202 and magnet pad 252 or under the effect of the direct bonding force between the microchip and the transfer substrate. As an example, microchips 200 are bonded to support substrate 401 by means of a polymer of type C4F8, TEFLON, or OPTOOL DSX, or by any other adhesive providing a bonding energy between microchips 200 and support substrate 401 smaller than the bonding energy between microchips 200 and transfer substrate 250.

As a variation, in the case where support substrate 401 is transparent, the bonding of microchips 200 to support substrate 401 may be achieved by a resin capable of being degraded by an ultraviolet radiation, for example, a resin of BREWER 305 type. A local laser illumination of the resin may then be performed through substrate 401, to selectively separate part of microchips 200.

In the case where support substrate 401 is the growth substrate of LEDs 110, the latter may have a relatively strong adherence to microchips 200. In this case, a method of selective separation by means of a local laser beam projected through substrate 401, for example, a method of the type described in patent application U.S. Pat. No. 6,071,795, may be used. For example, in the case of a sapphire growth substrate 401 and of gallium nitride LEDs, a 458-nm laser may be used, with an optical power in the range from 10 mW/mm$^2$ to 10 W/mm$^2$ and an exposure time in the range from 1 second to 1 minute for each chip to be separated. After the exposure to the laser, liquid gallium is present at the interface between the LED and the sapphire. The microchip then is held by capillarity on substrate 401, until it is transferred onto substrate 250.

It should be noted that, to increase the bonding force between microchips 200 and transfer substrate 250, and thus ease the separation from support substrate 401, an anneal aiming at increasing the bonding energy between the microchips and the transfer substrate, for example, at a temperature in the range from 150 to 250° C., may be performed before removing substrate 401 (FIG. 5C).

Figure 6:
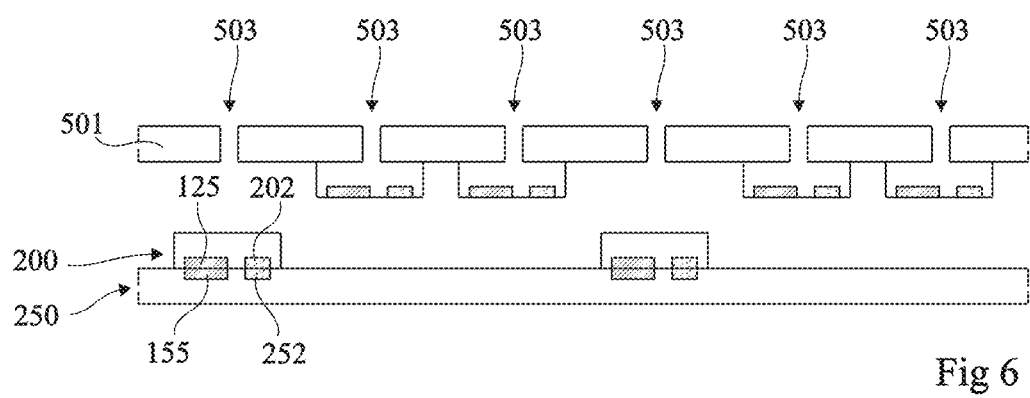
FIG. 6 is a cross-section view illustrating an alternative implementation of the method of FIGS. 5A to 5C.

FIG. 6 is a cross-section view illustrating an alternative embodiment of the method of FIGS. 5A to 5C.

The method of FIG. 6 differs from the method of FIGS. 5A to 5C mainly in that, in the method of FIG. 6, support substrate 401 of FIGS. 5A to 5C is replaced with a support substrate 501 comprising at least one through opening 503 opposite each microchip 200. The provision of through openings 503 enables to ease the selective separation of microchips 200 when they are transferred onto substrate 250. As an example, microchips 200 are maintained bonded to substrate 501 by an adhesive, and a compressed air flow is locally injected into the openings 503 located opposite the microchips to be detached, to obtain their separation. As a variation, microneedles may be used to selectively push the microchips to be detached through the corresponding openings 503. As a variation, the microchips are maintained bonded to substrate 501 by sucking in through openings 503, after which the sucking is locally interrupted opposite the microchips to be detached, to obtain their separation.

FIGS. 7A to 7D are cross-section views illustrating steps of another embodiment of a method of manufacturing an emissive display device comprising LEDs.

Figure 7A:
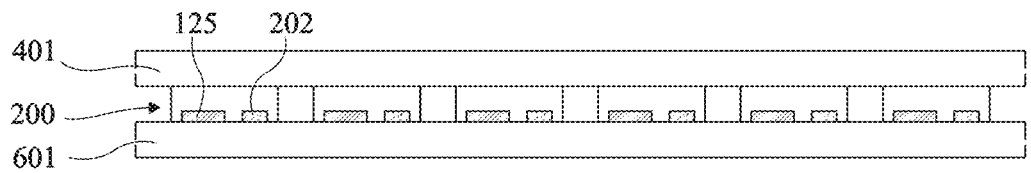
FIGS. 7A, 7B, 7C, and 7D are cross-section views illustrating steps of another embodiment of a method of manufacturing an emissive display device comprising LEDs.

FIG. 7A illustrates a step during which, after microchips 200 have been formed on a first support substrate 401 identically or similarly to what has been previously described in relation with FIG. 5A, microchips 200 are transferred from substrate 401 onto a second support substrate 601, with no pitch change. For this purpose, microchips 200 are arranged on substrate 601, using substrate 401 as a handle. Microchips 200 are placed into contact, by their connection surfaces, that is, their surfaces opposite to LEDs 110, with a surface of substrate 601. A temporary bonding by means of an adhesive layer may be provided between the connection surface of the microchips and substrate 601. As a variation, microchips 601 are simply laid on the upper surface of substrate 601. Initial support substrate 401 is then removed.

Figure 7B:
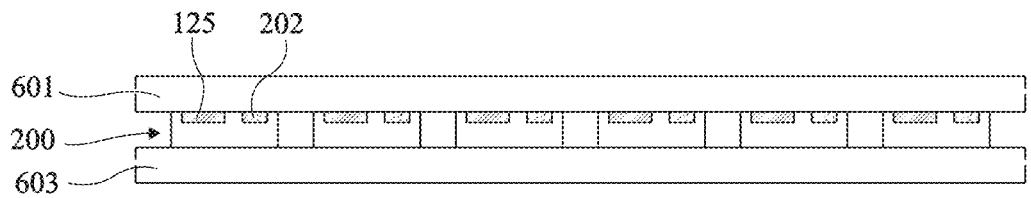

FIG. 7B illustrates a step subsequent to the removal of initial support substrate 401, during which microchips 200 are transferred from second support substrate 601 to the upper surface of a third support substrate 603, still keeping the initial pitch. In the case where microchips 200 are bonded to temporary support substrate 601 by an adhesive layer, the microchips may be placed on the upper surface of substrate 603 by using substrate 601 as a handle. In the case where microchips 200 are simply laid on the upper surface of temporary support substrate 601, substrate 603 may be laid on the upper surface of microchips 200, that is, on the side of LEDs 110, after which the assembly comprising substrate 601, microchips 200, and substrate 603 is flipped so that microchips 200 are on the upper surface side of substrate 603. Temporary support substrate 601 is then removed.

Figure 7C:
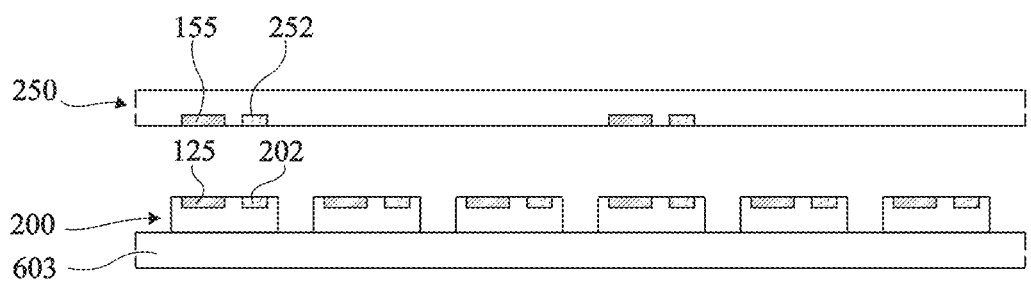

FIG. 7C illustrates a step subsequent to the removal of substrate 601. At this stage, microchips 200 are simply laid (and not bonded) on the upper surface of support substrate 603, the connection surfaces of the microchips facing upwards, that is, opposite substrate 603.

The transfer substrate 250 on which microchips 200 are desired to be affixed is then positioned above substrate 603 and microchips 200, with its connection surface facing the connection surfaces of the microchips. Microchips 200, laid on support substrate 603, are brought opposite to the corresponding reception areas of transfer substrate 250.

The magnetic force exerted by the magnet pads 252 of the transfer substrate on the ferromagnetic pads 202 of the microchips attracts microchips 200 (which are free to move with respect to substrate 603 due to the lack of bonding between the microchips and substrate 603) and results in accurately self-aligning the connection areas of each microchip with the corresponding electric connection areas of the transfer substrate. Microchips 200 are then affixed to transfer substrate 250 by direction bonding.

Figure 7D:
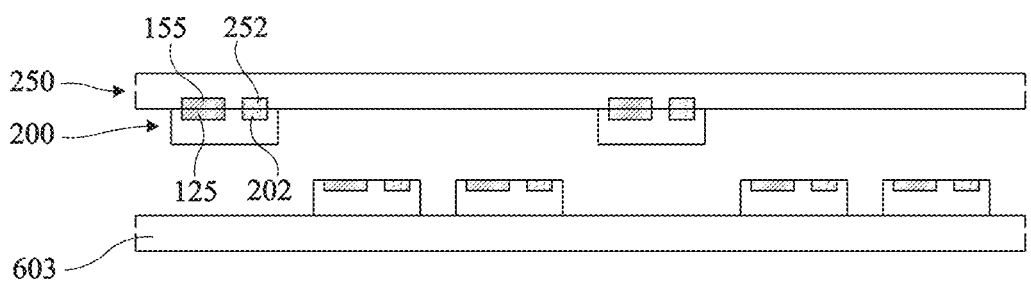

Transfer substrate 603 and the remaining microchips 200 may then be removed as illustrated in FIG. 7D.

FIGS. 8A to 8D are cross-section views illustrating steps of another embodiment of a method of manufacturing an emissive display device comprising LEDs.

The method of FIGS. 8A to 8D is similar to the method of FIGS. 7A to 7D, and differs from the method of FIGS. 7A to 7D mainly in that, in the method of FIGS. 8A to 8D, support substrates 601 and 603 of the method of FIGS. 7A to 7D are replaced with substrates 701 and 703, respectively. Substrates 701 and 703 differ from substrates 601 and 603 in that they each comprise, on the side of their surface intended to receive microchips 200, cavities 702 (for substrate 701), respectively 704 (for substrate 703), intended to receive microchips 200.

More particularly, when microchips 200 are transferred from initial support substrate 401 onto substrate 701 (FIG. 8A), each microchip 200 is arranged in a cavity 702 of substrate 701, and is separated from the other microchips 200 transferred onto substrate 701 by the lateral walls of cavity 702. In other words, the pitch of cavities 702 of substrate 701 is substantially identical to the pitch of microchips 200 on substrate 401. Similarly to what has been described in relation with FIGS. 7A to 7D, microchips 200 may be affixed to temporary support substrate 701 by an adhesive layer, or may be simply laid on substrate 701. Initial support substrate 401 is then removed.

Further, when microchips 200 are transferred from temporary support substrate 701 onto support substrate 703 (FIG. 8B), each microchip 200 is arranged in a cavity 704 of substrate 703, and is separated from the other microchips 200 by the lateral walls of cavity 704. In other words, the pitch of cavities 704 of substrate 703 is substantially identical to the pitch of microchips 200 on initial substrate 401. Similarly to what has been described in relation with FIGS. 7A to 7D, microchips 200 are simply laid on support substrate 703.

The other steps of the method are identical or similar to what has been previously described in relation with FIGS. 7A to 7D.

An advantage of the variation of FIGS. 8A to 8D is that it eases the handling of support substrate 701 and/or 703 once the latter have been loaded with microchips 200, due to the lateral holding of the microchips obtained by the provision of cavities 702, 704.

FIG. 9 is a cross-section view illustrating an alternative embodiment of the method of FIGS. 8A to 8D.

Figure 8A:
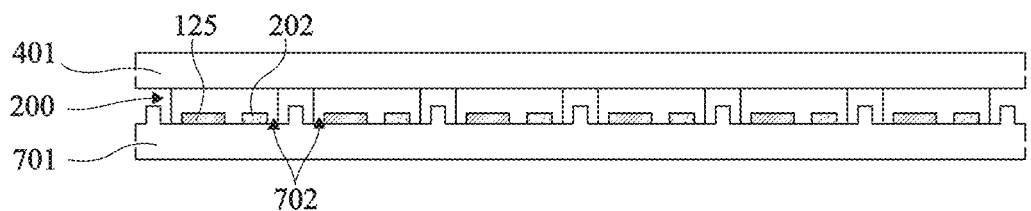
FIGS. 8A, 8B, 8C, and 8D are cross-section views illustrating steps of another embodiment of a method of manufacturing an emissive display device comprising LEDs.
Figure 8B:
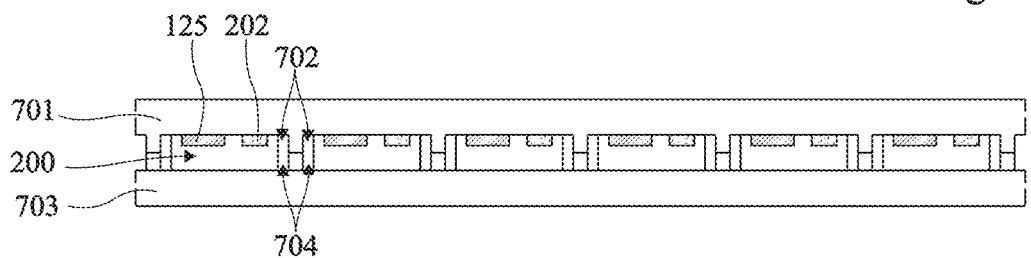
Figure 8C:
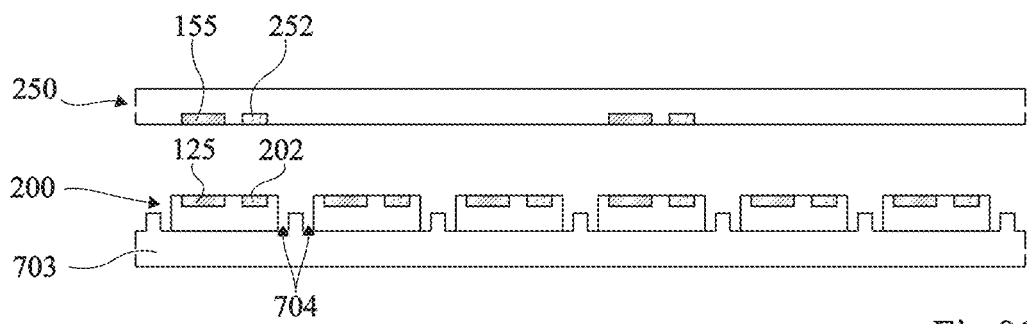
Figure 8D:
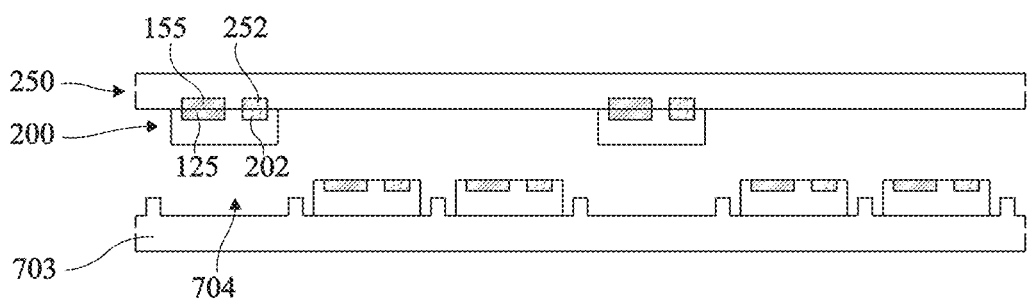

FIG. 9 more particularly illustrates a final step of the method, corresponding to the step of FIG. 8D.

In the variation of FIG. 9, support substrate 703 of the method of FIGS. 8A to 8D is replaced with a support substrate 803. Substrate 803 comprises cavities 804 for holding microchips 200, arranged with a pitch substantially equal to the pitch of the microchips on initial support substrate 401. Substrate 803 of the method of FIG. 9 differs from substrate 703 of the method of FIGS. 8A to 8D mainly in that the bottom of each cavity 804 of substrate 803 is non-planar. In other words, conversely to substrate 703 where the entire surface of a microchip 200 opposite to the connection surface of the microchip is in contact with the bottom of a cavity 704 of the substrate, in the example of FIG. 9, for each microchip 200, a portion only of the surface of the microchip opposite to its connection surface is in contact with the bottom of cavity 804 having the microchip arranged therein. This enables to prevent an unwanted bonding of microchips 200 to the bottom of the cavities of substrate 803, and thus to ease the collection of the microchips by transfer substrate 250 during the self-assembly step.

As an example, the bottom of each cavity 804 of substrate 803 may have a hollow shape, for example, the shape of a groove portion with a triangular cross-section. More generally, any other non-planar shape capable of obtaining the desired anti-bonding effect may be used, for example, a bulged shape.

FIGS. 10A to 10E are cross-section view illustrating steps of an embodiment of microchips 200 of the type described in relation with FIG. 4, that is, each comprising a planar connection surface with electric connection areas flush with the connection surface of the microchip, and a ferromagnetic pad buried under the connection surface of the microchip.

In the example of FIGS. 10A to 10E, only two electric connection areas 125 and 126 are shown in each microchip 200. In practice the number of electric connection areas per microchip may be greater than two.

Figure 10A:
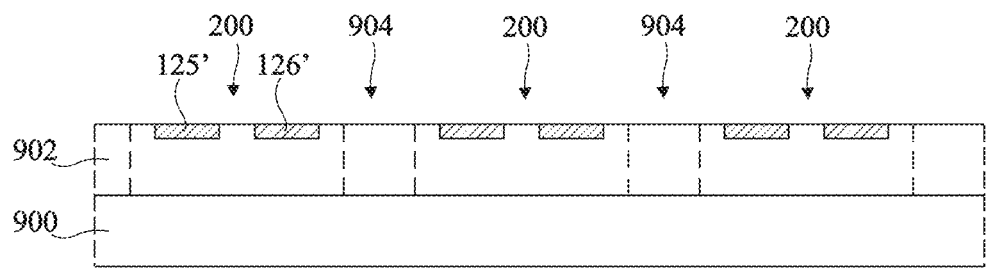
FIGS. 10A, 10B, 10C, 10D, and 10E are cross-section views illustrating steps of an example of a method of manufacturing a microchip of an emissive display device comprising LEDs according to an embodiment.

FIG. 10A illustrates a step during which it is started from an assembly comprising a support substrate 900 and, on the upper surface of support substrate 900, a stack 902 of semiconductor, conductive, and insulating layers, having the different microchip components formed therein, and particularly LEDs 110 and control circuits 120 (not detailed in FIGS. 10A to 10E). As an example, substrate 900 is the LED growth substrate, and each microchip comprises a LED 110 in a lower portion in contact with the upper surface of substrate 900, and a control circuit 120 in an upper portion in contact with the upper surface of LED 110.

At the step of FIG. 10A, microchips 200 have not been individualized yet. Broken lines represent the lateral edges of each microchip 200. Sawing paths 904 separate microchips 200 from one another.

At this step, the upper surface of stack 902 comprises, for each microchip 200, two electric connection areas 125' and 126', intended to be respectively connected to the areas of connection to the outside 125 and 126 of the microchip, which have not been formed yet.

Figure 10B:
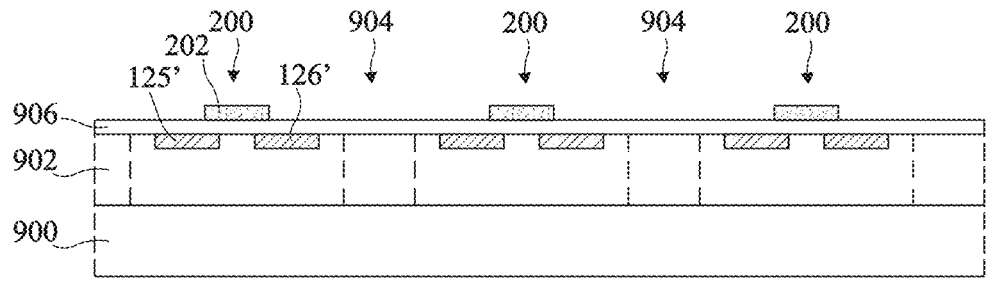

FIG. 10B illustrates a step of deposition of an insulating layer 906, for example an oxide layer, over the entire upper surface of the structure of FIG. 10A.

FIG. 10B further illustrates a step of forming of ferromagnetic pads 202 on the upper surface of insulating layer 906. As an example, the ferromagnetic material is first deposited over the entire upper surface of layer 906, and then etched to only keep one pad 202 per microchip 200.

Figure 10C:
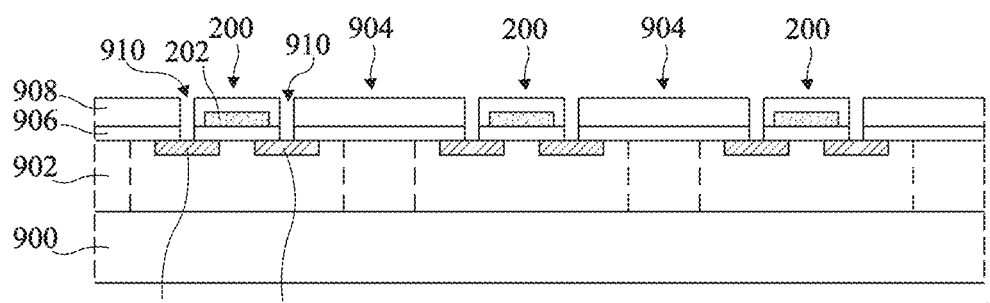

FIG. 10C illustrates a step of deposition of an insulating layer 908, for example, an oxide layer, over the entire upper surface of the structure of FIG. 10B, that is, over the upper surface of layer 906 and over the upper surface of ferromagnetic pads 202. The thickness of insulating layer 908 is preferably greater than the thickness of ferromagnetic pads 202.

FIG. 10C further illustrates a step of forming of openings 910 crossing insulating layers 908 and 906 opposite the electric connection areas 125' and 126' of each microchip 200. Openings 910 are formed by etching from the upper surface of layer 908, and emerge onto the upper surface of electric connection areas 125', respectively 126'.

Figure 10D:
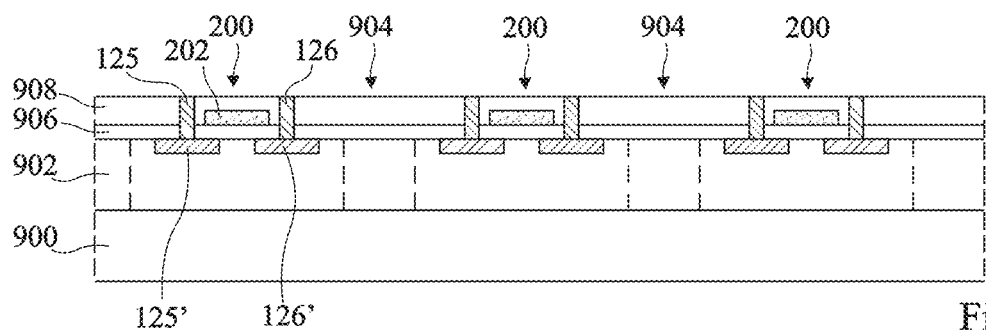

FIG. 10D illustrates a step of filling of openings 910 with a conductive material, for example, metal, to form the electric connection areas 125 and 126 of microchips 200. As an example, the conductive material is deposited over the entire upper surface of the structure of FIG. 10C, across a thickness at least equal to that of openings 910 to fill openings 910. A step of chem.-mech. polishing is then implemented to planarize the upper surface of the structure to place at a same level electric connection areas 125 and 126 and upper insulating layer 908.

Figure 10E:
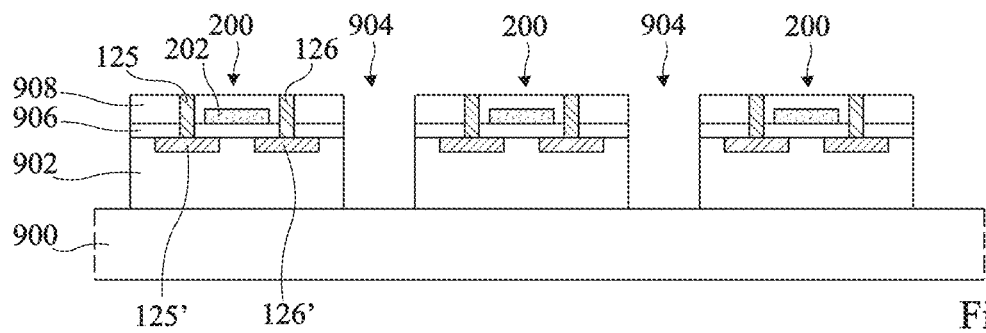

FIG. 10E illustrates a step of individualization of the microchips subsequent to the forming of electric connection areas 125 and 126. During this step, the stack comprising insulating layers 908 and 906 and stack 902 is removed, in sawing paths 904, from the upper surface of layer 908 to the upper surface of support substrate 900. A plurality of microchips 200 rigidly attached to substrate 900 is thus obtained, each microchip being coupled to substrate 900 by its surface opposite to its connection surface.

Specific embodiments have been described. Various alterations, modifications, and improvements will occur to those skilled in the art. In particular, the described embodiments are not limited to the specific examples of dimensions and of materials mentioned in the description.

Further, although only embodiments where each microchip comprises a ferromagnetic pad and each corresponding reception area of the transfer substrate comprises a magnet pad have been described, one may as a variation arrange the magnet pads in the microchips and the ferromagnetic pads in the transfer substrate.

As a variation, the ferromagnetic pads are replaced with magnet pads, that is, each microchip comprises a magnet pad and each corresponding reception area also comprises a magnet pad.

It should further be noted that the pads of the microchip and the corresponding pads of the transfer substrate may have different dimensions and/or shapes.

Further, to further increase the alignment accuracy, a plurality of ferromagnetic pads or a plurality of magnet pads per microchip and a plurality of corresponding magnet pads or a plurality of corresponding ferromagnetic pads per reception area of the transfer substrate may be provided, and the dimensions and/or shapes of the different pads may be different.

Further, although only embodiments where the microchips transferred onto the transfer substrate each comprise a LED and a circuit for controlling the LED have been described, the described embodiments are not limited to this specific case. As a variation, each microchip may comprise a plurality of LEDs and a circuit for controlling the plurality of LEDs. Further, in another variation, each microchip may comprise one or a plurality of LEDs only, with no control circuit, the LED(s) of the microchip being then controlled by circuits external to the microchip, for example arranged at the periphery of the transfer substrate.

It should further be noted that the described methods may be applied to other fields than to the forming of emissive display devices comprising LEDs. More generally, the described methods apply to the forming of any electronic device comprising a plurality of microchips transferred onto a transfer substrate, where the microchips are affixed and electrically connected to the transfer substrate by direct bonding, and where each microchip comprises at least two electric connection areas on its surface of connection to the transfer substrate.

The invention claimed is:

1. A method of manufacturing an electronic device, comprising the steps of:
   a) forming a plurality of chips, each comprising:
      at least one LED;
      an active circuit for controlling the at least one LED, on a lower surface of the active circuit of the chip, a first, a second, a third, and a fourth electric connection areas, the first, second, third, and fourth electric connection areas being intended to receive respectively a low power supply potential, a high power supply potential, a chip selection signal, and a luminosity data signal, the first electric connection area being connected to a terminal of the at least one LED by a conductive via extending vertically through the active circuit; and
      at least one first pad arranged in the vicinity of the lower surface of the active circuit of the chip;
   b) forming a transfer substrate separate from the plurality of chips, the transfer substrate comprising, for each chip:
      on an upper surface of the transfer substrate, a first, a second, a third, and a fourth electric connection area intended to be respectively connected to the first, second, third, and fourth electric connection areas of the active circuit of the chip; and
      at least one second pad arranged in the vicinity of the upper surface of the transfer substrate, one of the first and second pads being a permanent magnet and the other of the first and second pads being either a permanent magnet or made of a ferromagnetic material; and
   c) affixing the chips to the transfer substrate by direct bonding to electrically connect the electric connection areas of each chip to the corresponding electric connection areas of the transfer substrate, by using the magnetic force between the first and second pads to align the electric connection areas of the chips with the corresponding electric connection areas of the transfer substrate,
   wherein affixing the chips to the transfer substrate includes electrically connecting the at least one LED and the active circuit of each chip to the corresponding electric connection areas of the transfer substrate;
   wherein the active circuit of each chip comprises:
      a first metal-oxide-semiconductor (MOS) transistor having a first conduction node connected to the second electric connection area and a second conduction node connected to a second terminal of the at least one LED;
      a second MOS transistor having a first conduction node connected to a gate of the first MOS transistor, a second conduction node connected to the fourth electric connection area, and a gate connected to the third electric connection area; and
      at least one capacitive element for holding a bias signal for the individual control of the at least one LED.

2. The method of claim 1, wherein, in each chip, the first pad emerges on the side of the connection surface of the microchip.

3. The method of claim 1, wherein, in each chip the first pad is buried under the connection surface of the chip.

4. The method of claim 1, wherein, in each chip, the connection surface of the chip is planar, the electric connection areas of the chip being flush with an external surface of a passivation layer of the chip.

5. The method of claim 1, wherein the second pads emerge on the side of the connection surface of the transfer substrate.

6. The method of claim 1, wherein the second pads are buried under the connection surface of the transfer substrate.

7. The method of claim 1, wherein, in each chip, the connection surface of the transfer substrate is planar, the electric connection areas of the transfer substrate being flush with an external surface of a passivation layer of the transfer substrate.

8. The method of claim 1, wherein the electric connection areas of the transfer substrate protrude from the connection surface of the transfer substrate.

9. The method of claim 1, wherein:
at the end of step a), the chips are arranged on a support substrate with a pitch between chips smaller than the pitch between chips of the final display device; and
at step c), a plurality of chips are selectively separated from the support substrate at the pitch of the final display device and affixed to the transfer substrate at this same pitch.

10. The method of claim 9, wherein:
at the end of step a), the chips are only laid, with no bonding, on the support substrate; and
at step c), the transfer substrate is brought above the chips, with its connection surface facing the connection surfaces of the chips, to simultaneously collect a plurality of chips at the pitch of the final display device.

11. The method of claim 10, wherein the support substrate comprises cavities having the chips arranged therein so that the chips are laterally held by the cavity walls.

12. The method of claim 11, wherein the bottom of each cavity of the support substrate is non-planar.

13. An emissive display device comprising LEDs formed by the method of claim 1.

14. The method of claim 1, wherein at step c), the direct bonding is performed at ambient temperature and pressure.

* * * * *